United States Patent
Speichermann

(10) Patent No.: US 11,747,217 B2
(45) Date of Patent: Sep. 5, 2023

(54) ELECTRICAL OR ELECTRONIC CONTROL DEVICE

(71) Applicant: Dr. Ing. h.c. F. Porsche Aktiengesellschaft, Stuttgart (DE)

(72) Inventor: Justus Speichermann, Stuttgart (DE)

(73) Assignee: Dr. Ing. h.c. F. Porsche Aktiengesellschaft

(*) Notice: Subject to any disclaimer, the term of this patent is extended or adjusted under 35 U.S.C. 154(b) by 109 days.

(21) Appl. No.: 17/492,770

(22) Filed: Oct. 4, 2021

(65) Prior Publication Data
US 2022/0107226 A1  Apr. 7, 2022

(30) Foreign Application Priority Data
Oct. 5, 2020 (DE) ............ 10 2020 125 942.5

(51) Int. Cl.
*G01K 7/34* (2006.01)
*B60R 16/023* (2006.01)
*H02H 1/00* (2006.01)
*H02H 9/00* (2006.01)

(52) U.S. Cl.
CPC ............ *G01K 7/34* (2013.01); *B60R 16/023* (2013.01); *H02H 1/0007* (2013.01); *H02H 9/00* (2013.01)

(58) Field of Classification Search
CPC ................ G01K 7/34; H02H 1/0007
See application file for complete search history.

(56) References Cited

U.S. PATENT DOCUMENTS

| | | | |
|---|---|---|---|
| 9,860,986 B2 | 1/2018 | Tazarine et al. | |
| 2017/0215271 A1 | 7/2017 | Ito et al. | |
| 2019/0154617 A1* | 5/2019 | Silvano de Sousa | G01N 27/223 |
| 2019/0217781 A1 | 7/2019 | Tomar | |
| 2020/0106257 A1* | 4/2020 | Gupta | G01R 19/16542 |

FOREIGN PATENT DOCUMENTS

| | | |
|---|---|---|
| DE | 3937183 A1 | 1/1991 |
| DE | 102014006841 A1 | 11/2015 |
| EP | 3461241 A1 | 3/2019 |
| EP | 3489646 A1 | 5/2019 |

OTHER PUBLICATIONS

Great Britain Search Report for GB Application No. 2114247.6, dated Jun. 17, 2022, 1 page.

* cited by examiner

*Primary Examiner* — Scott Bauer
(74) *Attorney, Agent, or Firm* — RatnerPrestia

(57) ABSTRACT

Electrical or electronic control device has an electrical or electronic assembly, which includes a printed circuit board composed of an electrically insulating carrier material, electrically conductive conductor tracks formed on the printed circuit board, and electrical or electronic modules connected to the printed circuit board and via the conductor tracks. A coating is applied at least in sections to the electrical or electronic assembly. The coating includes at least the following layers: a first electrical conductor layer, a second electrical conductor layer, a dielectric layer arranged between the first conductor layer and the second conductor layer, an insulator layer applied to the second conductor layer in such a way that the second conductor layer is arranged between the dielectric layer and the insulator layer. An evaluation unit is connected to the conductor layers and detects a change in capacitance of the coating.

15 Claims, 1 Drawing Sheet

ELECTRICAL OR ELECTRONIC CONTROL DEVICE

CROSS-REFERENCE TO RELATED APPLICATION

This application claims priority to German Patent Application No. 10 2020 125 942.5, filed Oct. 5, 2020, the content of such application being incorporated by reference herein in its entirety.

FIELD OF THE INVENTION

The invention relates to an electrical or electronic control device.

BACKGROUND OF THE INVENTION

Electrical or electronic control devices known from practice have an electrical or electronic assembly, which comprises a printed circuit board composed of an electrically insulating carrier material having electrically conductive conductor tracks formed on the printed circuit board and electrical or electronic modules connected to the printed circuit board and via the conductor tracks. Such an electrical or electronic assembly having the printed circuit board, the electrically conductive conductor tracks and the electrical or electronic modules is also referred to as a populated printed circuit board. During operation, an electrical or electronic control device of this kind is subjected to heating as a result of the resistance of the electrically conductive conductor tracks and the electrical or electronic modules and also as a result of the current that flows. An impermissibly high degree of heating can lead to a malfunction of or even damage to the electrical or electronic control device. Until now, it has been difficult to easily and reliably detect such heating of an electrical or electronic control device.

DE 10 2014 006 841 A1, which is incorporated by reference herein, discloses a circuit arrangement of a motor vehicle. The circuit arrangement has a metallic carrier plate, a metallic printed circuit board and semiconductor modules. The metallic carrier plate is spaced apart from the metallic printed circuit board in an electrically insulated manner. The carrier plate and the printed circuit board are electrically connected by means of a semiconductor module and form an electrical three-pole.

DE 39 37 183 A1, which is incorporated by reference herein, discloses a printed circuit board arrangement having a printed circuit board composed of an insulating carrier material. Conductor tracks are formed on the front side and the rear side of the printed circuit board. The printed circuit board is embodied as a multi-layer printed circuit board in such a way that layer levels thereof form an interference-suppression capacitor.

US 2019/0 217 781 A1, which is incorporated by reference herein, discloses an electrical or electronic control device of a vehicle.

US 2017/0 215 271 A1, which is incorporated by reference herein, and EP 3 461 241 A1, which is incorporated by reference herein, disclose further prior art.

SUMMARY OF THE INVENTION

An electrical or electronic control device has an electrical or electronic assembly, which comprises a printed circuit board composed of an electrically insulating carrier material, electrically conductive conductor tracks formed on the printed circuit board and electrical or electronic modules connected to the printed circuit board and via the conductor tracks.

The electrical or electronic control device furthermore has a coating applied at least in sections to the electrical or electronic assembly, wherein the coating comprises at least the following layers: a first electrical conductor layer, a second electrical conductor layer, a dielectric layer arranged between the first conductor layer and the second conductor layer, and an insulator layer applied to the second conductor layer in such a way that the second conductor layer is arranged between the dielectric layer and the insulator layer.

The electrical or electronic control device furthermore has an evaluation unit, which is connected to the conductor layers and which detects a change in capacitance of the coating, caused by a change in temperature of the electrical or electronic assembly, based on measurement variables tapped at the conductor layers of the coating.

The evaluation unit is preferably contact-connected to the first electrical conductor layer of the coating and the second electrical conductor layer of the coating by means of a respective measurement line.

The first electrical conductor layer, the second electrical conductor layer, the dielectric layer arranged between the first conductor layer and the second conductor layer and the insulator layer applied to the second conductor layer are arranged above one another in the manner of a sandwich. The coating applied at least in sections to the electrical or electronic assembly forms a measurement capacitor. When the electrical or electronic control device is heated, the dielectric layer of the coating changes its permittivity and therefore the measurement capacitor provided by the coating changes its capacitance. The change in capacitance caused is used as a measure for a change in temperature of the control device. This permits simple and reliable identification of an increase in temperature at the control device. If the change in capacitance identified or the change in temperature identified should be impermissibly high, suitable countermeasures can be taken.

According to one advantageous development, the coating is applied at least in sections to at least one of the electrically conductive conductor tracks of the assembly indirectly in such a way that a further insulator layer of the coating is arranged between the respective electrically conductive conductor track and the first electrical conductor layer of the coating. As an alternative or in addition, the coating is applied at least in sections to at least one of the electrical or electronic modules of the assembly indirectly in such a way that a further insulator layer of the coating is arranged between the respective electrical or electronic module and the first electrical conductor layer of the coating. As an alternative or in addition, the coating is applied at least in sections to the electrically insulating carrier material of the printed circuit board directly in such a way that the first electrical conductor layer of the coating is applied to the electrically insulating carrier material of the printed circuit board directly.

The coating comprises at least four layers, namely at least the first and second conductor layer, the dielectric layer arranged between said conductor layers and also the insulator layer arranged toward the outside, said insulator layer being applied to the second conductor layer in such a way that the second conductor layer is arranged between the dielectric layer and the insulator layer. If the coating in the region of electrically conductive components of the electrical electronic assembly is applied to the electrical or electronic assembly, in particular in the region of electrically conductive conductor tracks, a further insulator layer is present as fifth layer, which is arranged as the innermost layer between the respective electrically conductive component of the electrical or electronic assembly and the first conductor layer.

The evaluation unit of the control device preferably triggers a test or maintenance of the control device when the change in capacitance of the coating detected by said evaluation unit is greater than a first limit value. The evaluation unit triggers a load reduction when the detected change in capacitance of the coating is greater than a second limit value. This permits particularly advantageous triggering of countermeasures, namely when the change in capacitance is impermissibly high. Firstly, a test or maintenance of the control device can be triggered when the change in capacitance is greater than a first limit value. If the change in capacitance should become even greater and be greater than a second limit value, a load reduction can be triggered in order to prevent damage to the control device as a result of an impermissibly high change in temperature, in particular an increase in temperature.

BRIEF DESCRIPTION OF THE DRAWINGS

Preferred developments of the invention will emerge from the dependent claims and the description below. Exemplary embodiments of the invention will be explained in more detail on the basis of the drawing, without being restricted thereto. In the drawing:

DETAILED DESCRIPTION OF THE INVENTION

The invention relates to an electrical or electronic control device. In particular, the electrical or electronic control device is a control device of a vehicle, such as a land vehicle, aircraft or watercraft.

The invention is particularly preferably used in electrically driven vehicles in the field of an electrical or electronic control device, which is a component part of a high-voltage system. The invention can be used, for example, in a control device of a land vehicle designed as an electric vehicle or hybrid vehicle, in particular a passenger vehicle, in particular in the field of the power electronics system of a vehicle of this type.

Figure 1:
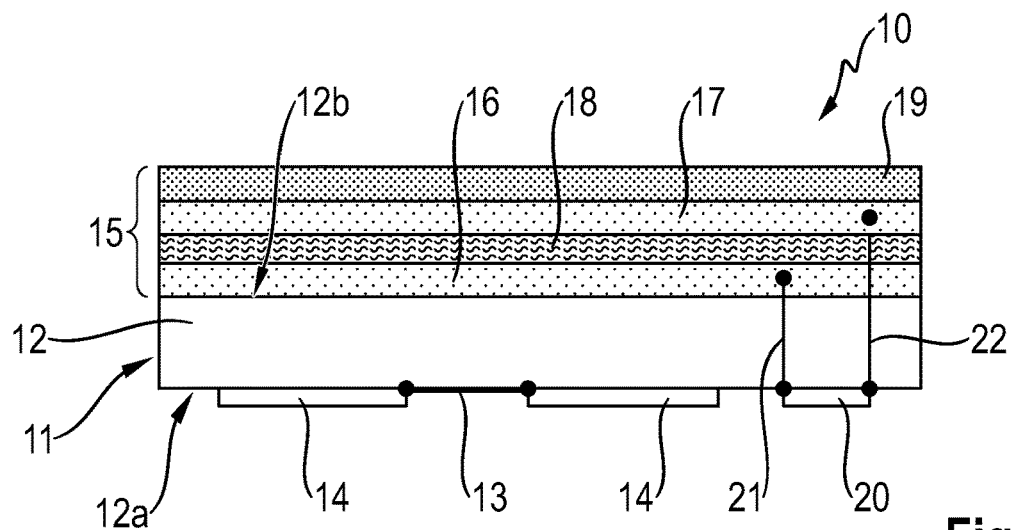
FIG. 1 shows a schematic view of a first electrical or electronic control device.

FIG. 1 highly schematically shows an electrical or electronic control device 10 having an electrical or electronic assembly 11, wherein said assembly 11 in the exemplary embodiment of FIG. 1 comprises a printed circuit board 12 composed of an electrically insulating carrier material, electrically conductive conductor tracks 13 formed on the printed circuit board 12 and electrical or electronic modules 14 connected to the printed circuit board 12 and by means of the conductor tracks 13. In FIG. 1, said modules 14 are arranged on a first side 12a of the printed circuit board 12.

The electrical or electronic control device 10 furthermore has a coating 15 applied at least in sections to the electrical or electronic assembly 11.

In the exemplary embodiment of FIG. 1, said coating 15 is applied over an area, in particular over the full area, to the side 12b of the printed circuit board 12 located opposite the side 12a of the printed circuit board 12.

In the exemplary embodiment of FIG. 1, said coating 15 comprises a first electrical conductor layer 16 facing the electrical or electronic assembly 11, a second conductive layer 17 facing away from the electrical or electronic assembly, a dielectric layer 18 arranged between the first conductor layer 16 and the second conductor layer 17, and an insulator layer 19 applied to the second conductor layer 17 in such a way that the second conductor layer 17 is arranged between the dielectric layer 18 and the insulator layer 19.

The first electrical conductor layer 16, the second electrical conductor layer 17, the dielectric layer 18 arranged between the first conductor layer 16 and the second conductor layer 17 and the insulator layer 19 applied to the second conductor layer 17 are arranged above one another in the manner of a sandwich.

The above layers 16, 17, 18 and 19 are accordingly applied to the side 12b of the printed circuit board 12 in layers or in the manner of a sandwich, namely firstly the first conductor layer 16, which is applied directly to the side 12b of the printed circuit board 12 composed of the electrically insulating carrier material, then the dielectric layer 18, which is applied directly to the first conductor layer 16, then the second conductor layer 17, which is applied directly to the dielectric layer 18, and then the insulator layer 19, which is applied directly to the second conductor layer 17.

The coating 15 forms a measurement capacitor.

The control device 10 furthermore has an evaluation unit 20, which is electrically conductively connected to the two conductor layers 16, 17 and specifically in FIG. 1 by means of measurement lines 21, 22.

The measurement line 21 extends starting from the first conductor layer 16 through the printed circuit board 12 and is contact-connected to the evaluation unit 20. The measurement line 22 extends starting from the second conductor layer 17 likewise through the printed circuit board 12 and is electrically conductively contact-connected to the evaluation unit 20. The measurement line 22 is electrically insulated from the layers 16 and 18.

As stated above, the evaluation unit 20 detects a change in capacitance of the coating 15, caused in particular by an increase in temperature of the electrical or electronic assembly 11, based on measurement variables tapped at the conductor layers 16, 17 of the coating 15.

When the evaluation unit determines that a detected change in capacitance of the coating 15 is or becomes greater than a first limit value, the evaluation unit 20 can trigger a test or maintenance of the control device 10, for example by virtue of a fault entry being stored, which then triggers a test of the control device in a next maintenance interval.

When a detected change in capacitance of the coating 15 is or becomes greater than a second limit value, which is greater than the first limit value, the evaluation unit 20 can trigger a load reduction in order, for example, to reduce electric currents and/or electric voltages and to thus counteract an impermissibly high heating of the control device 10 in order to thus prevent damage to same.

Figure 2:
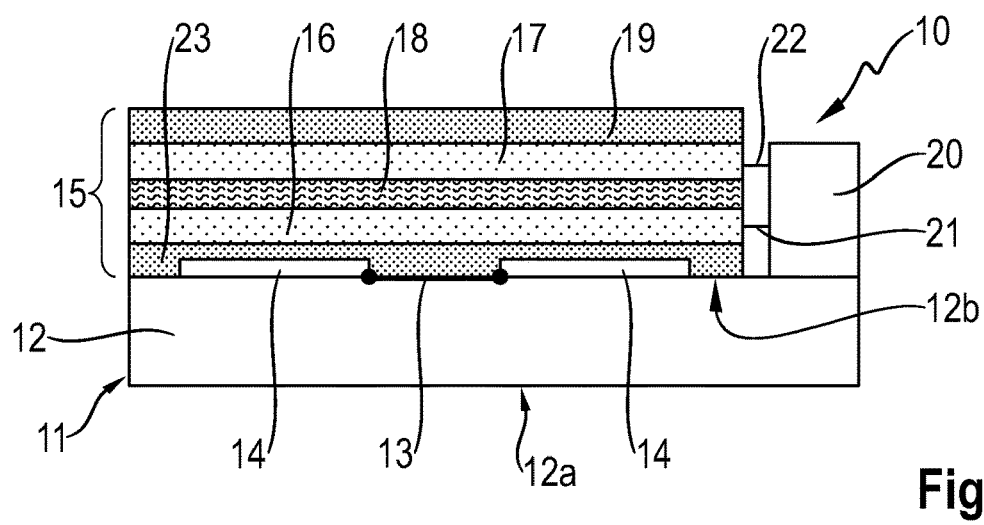
FIG. 2 shows a schematic view of a second electrical or electronic control device.

FIG. 2 shows a further electrical or electronic control device 10, which differs from the exemplary embodiment of FIG. 1 in that the electrical or electronic modules 14 of the electrical or electronic assembly 11 and also the coating 15 are applied to the same side 12b of the printed circuit board 12.

Here, in FIG. 2, the coating 15 extends over an area, namely over the full area, of the side 12b of the printed circuit board 12 and specifically also over the electrical or electronic modules 14 and the electrically conductive conductor tracks 13. In this case, in addition to the two conductor layers 16 and 17, the dielectric layer 18 and the outer insulator layer 19, the coating 15 comprises a further, inner insulator layer 23, which is applied to the modules 14 and the conductor tracks 13 accessible at the side 12b. The first conductor layer 16 is then arranged between the further insulator layer 23 and the dielectric layer 18.

The evaluation unit 20 of the control device 10 is in turn electrically conductively contact-connected to the two conductor layers 16 and 17 of the coating 15 by means of measurement lines 21 and 22 in order to tap measurement variables and to detect a change in capacitance of the coating 15, caused by an increase in temperature of the electrical or electronic assembly, on the basis of said measurement variables.

Figure 3:
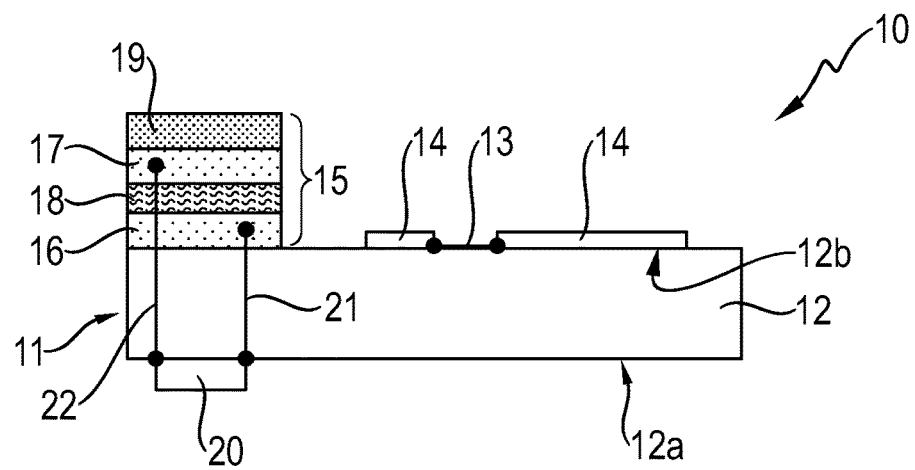
FIG. 3 shows a schematic view of a third electrical or electronic control device.

FIG. 3 shows a further exemplary embodiment of an electrical or electronic control device 10 according to the invention, wherein, in FIG. 3, the coating 15, which provides the measurement capacitor, is applied to the same side 12b of the printed circuit board 12 as the electrical or electronic modules 14, but outside of the region of said modules 14 and outside of the region of electrically conductive conductor tracks 13. In FIG. 3, the coating 15 is accordingly applied exclusively to the electrically insulating material of the printed circuit board 12, with the result that the inner or further insulator layer 23 can be omitted.

In addition to the measurement capacitor function, the respective coating 15 can provide a protective function for the printed circuit board 12.

As shown in FIGS. 1, 2 and 3, the coating 15 can be applied to the corresponding side of the printed circuit board 12 over an area and specifically over a full area or part of an area, alternatively in the manner of a grid so as to form a grid.

Accordingly, it lies within the scope of the present invention to apply a coating 15, which forms a measurement capacitor, to an electrical or electronic assembly 11 of a control device 10. In the event of a change in temperature, in particular an increase in temperature, in the region of the electrical or electronic assembly 11, the dielectric layer 18 of the coating 15 changes its permittivity. A change in capacitance of the measurement capacitor provided by the coating 15 is thus brought about, which can be detected metrologically. To this end, the conductor layers 16, 17 of the coating 15 are contact-connected to the evaluation unit 20, which detects the change in capacitance, by means of measurement lines 21, 22. The change in capacitance can be translated to a change in temperature, for example, in a manner dependent on the characteristic map or in a manner dependent on the characteristic curve.

Irrespective of whether the change in capacitance or the change in temperature falls below a respective limit value, the evaluation unit 20 can trigger countermeasures, either in order to trigger a test or maintenance of the control device 10 or else to trigger a load reduction.

The invention permits a check within the shortest time to determine whether the control device 10 is exposed to impermissibly high heating. As a result of this, a control device 10 can be protected from damage in order to increase the lifetime of same.

In addition to the measurement capacitor function, the coating 15 can provide a mechanical protective function for the printed circuit board 12.

The invention is used, in particular, in control devices of a high-voltage system of a vehicle, thus in a high-voltage system of an electric vehicle or hybrid vehicle.

What is claimed is:

1. An electrical or electronic control device for a vehicle, said electrical or electronic control device comprising:
   an electrical or electronic assembly, which comprises a printed circuit board composed of an electrically insulating carrier material, electrically conductive conductor tracks formed on the printed circuit board and electrical or electronic modules connected to the printed circuit board via the conductor tracks;
   a coating applied to a side of the printed circuit board and at least in sections to the electrical or electronic assembly, wherein the coating comprises at least the following layers: a first electrical conductor layer, a second electrical conductor layer, a dielectric layer arranged between the first conductor layer and the second conductor layer, and an insulator layer applied to the second conductor layer in such a way that the second conductor layer is arranged between the dielectric layer and the insulator layer; and
   an evaluation unit connected to the first and second electrical conductor layers and that is configured to detect a change in capacitance of the coating caused by a change in temperature of the electrical or electronic assembly based on measurement variables measured at the conductor layers of the coating.

2. The electrical or electronic control device as claimed in claim 1, wherein the coating is applied at least in sections to at least one of the conductor tracks of the assembly indirectly in such a way that a further insulator layer of the coating is arranged between the respective conductor track and the first electrical conductor layer of the coating.

3. The electrical or electronic control device as claimed in claim 1, wherein the coating is applied at least in sections to at least one of the electrical or electronic modules of the assembly indirectly in such a way that a further insulator layer of the coating is arranged between the respective electrical or electronic module and the first electrical conductor layer of the coating.

4. The electrical or electronic control device as claimed in claim 1, wherein the coating is applied at least in sections to the electrically insulating carrier material of the printed circuit board directly in such a way that the first electrical conductor layer of the coating is directly applied to the electrically insulating carrier material of the printed circuit board.

5. The electrical or electronic control device as claimed in claim 1, wherein the coating is applied to at least one side of the electrical or electronic assembly over the full area.

6. The electrical or electronic control device as claimed in claim 1, wherein the coating is applied in the manner of a grid to at least one side of the electrical or electronic assembly.

7. The electrical or electronic control device as claimed in claim 1, wherein the evaluation unit is configured to trigger a test or maintenance of the control device when a detected change in capacitance or change in temperature of the coating is greater than a first limit value.

8. The electrical or electronic control device as claimed in claim 7, wherein the evaluation unit is configured to trigger a load reduction when the detected change in capacitance or change in temperature of the coating is greater than a second limit value that differs from the first limit value.

9. The electrical or electronic control device as claimed in claim 1, wherein the evaluation unit is contact-connected to the first electrical conductor layer of the coating and the second electrical conductor layer of the coating by a respective measurement line.

10. A high-voltage system of a land vehicle configured as an electric vehicle or hybrid vehicle comprising the electrical or electronic control device as claimed in claim 1.

11. A vehicle comprising the electrical or electronic control device of claim 1.

12. The vehicle of claim 11 wherein the vehicle is a land vehicle, aircraft or watercraft.

13. The electrical or electronic control device as claimed in claim 1, wherein the first electrical conductor layer and the second electrical conductor layer extend through the width of the coating.

14. An electrical or electronic control device for a vehicle, said electrical or electronic control device comprising:
- an electrical or electronic assembly, which comprises a printed circuit board composed of an electrically insulating carrier material, electrically conductive conductor tracks formed on the printed circuit board and electrical or electronic modules connected to the printed circuit board via the conductor tracks;
- a coating applied at least in sections to the electrical or electronic assembly, wherein the coating comprises at least the following layers: a first electrical conductor layer, a second electrical conductor layer, a dielectric layer arranged between the first conductor layer and the second conductor layer, and an insulator layer applied to the second conductor layer in such a way that the second conductor layer is arranged between the dielectric layer and the insulator layer, wherein the first electrical conductor layer and the second electrical conductor layer extend through a width of the coating; and
- an evaluation unit connected to the first and second electrical conductor layers and that is configured to detect a change in capacitance of the coating caused by a change in temperature of the electrical or electronic assembly based on measurement variables measured at the conductor layers of the coating.

15. An electrical or electronic control device for a vehicle, said electrical or electronic control device comprising:
- an electrical or electronic assembly, which comprises a printed circuit board composed of an electrically insulating carrier material, electrically conductive conductor tracks formed on the printed circuit board and electrical or electronic modules connected to the printed circuit board via the conductor tracks;
- a coating applied at least in sections to the electrical or electronic assembly, wherein the coating comprises at least the following layers: a first electrical conductor layer, a second electrical conductor layer, a dielectric layer arranged between the first conductor layer and the second conductor layer, and an insulator layer applied to the second conductor layer in such a way that the second conductor layer is arranged between the dielectric layer and the insulator layer, wherein the first electrical conductor layer of the coating is directly applied to the electrically insulating carrier material of the printed circuit board; and
- an evaluation unit connected to the first and second electrical conductor layers and that is configured to detect a change in capacitance of the coating caused by a change in temperature of the electrical or electronic assembly based on measurement variables measured at the conductor layers of the coating.

* * * * *